(12) United States Patent
Itoh et al.

(10) Patent No.: US 6,406,246 B1
(45) Date of Patent: Jun. 18, 2002

(54) DEVICE HANDLER

(75) Inventors: Akihiko Itoh; Yoshihito Kobayashi, both of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/461,208

(22) Filed: Dec. 15, 1999

(30) Foreign Application Priority Data

Dec. 15, 1998 (JP) .......................................... 10-356348

(51) Int. Cl.$^7$ ................................................. G01R 31/02
(52) U.S. Cl. ..................... 414/274; 414/282; 324/158.1
(58) Field of Search ............................... 414/274, 282, 414/222.02; 324/158.1

(56) References Cited

U.S. PATENT DOCUMENTS

| | | | | |
|---|---|---|---|---|
| 5,303,214 A | * | 4/1994 | Kulakowski et al. | 369/34 |
| 5,313,156 A | * | 5/1994 | Klug et al. | 324/158 F |
| 5,323,327 A | * | 6/1994 | Carmichael et al. | 364/478 |
| 5,661,287 A | * | 8/1997 | Schaefer et al. | 253/383 |
| 5,729,464 A | * | 3/1998 | Dimitri | 364/478.03 |
| 5,805,472 A | * | 9/1998 | Fukasawa | 364/579 |
| 5,807,066 A | * | 9/1998 | Smith | 414/802 |
| 6,016,291 A | * | 1/2000 | Joos | 369/36 |
| 6,138,909 A | * | 10/2000 | Rockwell et al. | 253/383 |

FOREIGN PATENT DOCUMENTS

JP  521993  * 1/1993

* cited by examiner

*Primary Examiner*—Steven A. Bratlie
(74) *Attorney, Agent, or Firm*—Birch, Stewart, Kolasch & Birch, LLP

(57) ABSTRACT

A device handler having a device holder 200 in which are provided a plurality of feed stockers 201 and/or storing stockers 202, provided with an IC card reader 260 able to read and/or write identification data of an IC card 270 provided at each of the feed stockers 201 and/or storing stockers 202 and a movement mechanism 205 for moving the IC card reader 260 inside the device holder 200. The movement mechanism 205 is a tray movement arm. It is possible to simplify the configuration of the handler and lower the cost while enabling extremely easy reading and/or writing of identification data provided at the feed stocker and/or storing stocker.

11 Claims, 11 Drawing Sheets

# DEVICE HANDLER

BACKGROUND OF THE INVENTION

1. Field of the Invention

The present invention relates to a device handler having a device holder in which a plurality of feed stockers and/or storing stockers are provided, more particularly relates to a device handler designed to simplify the configuration of the handler and lower the cost while enabling extremely easy reading and/or writing of identification data provided at a feed stocker and/or storing stocker.

2. Description of the Related Art

In the process of production of a semiconductor device or the like, a tester is necessary for testing the finally produced IC chip or other electronic device. In this type of tester, a device handler (hereinafter also known as a "handler") is necessary. The handler takes out a device tray from a feed stocker holding pre-test IC chips, then reloads the pre-test IC chips held on the device tray on to a test tray and conveys them to a test head. Further, the handler transfers IC chips finished being tested at the test head to sorting use device trays in accordance with the test results and sorts and reloads the sorting device trays in a sorting use device storing stocker.

Therefore, the handler is formed with a device holder in which a plurality of feed stockers and/or storing stockers are provided. The device holder is provided with a number of data discriminators, corresponding to the number of stockers, able to read and/or write identification information provided at the stockers for the purposes of quality control of the IC chips held in the plurality of provided feed stockers and/or storing stockers, production control, and prevention of mistaken intermixture of types of devices.

Since however data discriminators are provided at the handler in a number corresponding to the number of stockers provided at the device holder, the configuration of the handler becomes complicated and the software for discriminating the identification data becomes troublesome and therefore there is the problem that the cost of the handler cannot be lowered.

SUMMARY OF THE INVENTION

The present invention was made in view of this actual situation and has as its object to provide a device handler designed to simplify the configuration of the handler and lower the cost while enabling extremely easy reading and/or writing of identification data provided at a feed stocker and/or storing stocker.

To achieve the above object, a device handler according to the present invention is a device handler having a device holder in which a plurality of feed stockers and/or storing stockers are provided, characterized by comprising a data discriminator able to read and/or write identification data provided at each of the feed stockers and/or storing stockers and a movement mechanism for moving relatively the data discriminator with respect to the feed stockers and/or storing stockers in the device holder.

The feed stockers and/or storing stockers preferably are detachably attached to the device handler, but may also be fixed to the device handler. Further, the data discriminator may be fixed in the device holder and the feed stockers and/or storing stockers may be attached movably with respect to the data discriminor in the device holder.

The movement mechanism preferably serves also as a tray movement mechanism for taking out device trays from the feed stockers and/or sorting and storing the device trays in the storing stockers.

The identification data provided at each of the feed stockers and/or storing stockers is not particularly limited, but an optically readable mark, magnetic data readable by a magnetic head, IC card data readable by non-contact type communication, and IC card data readable by contact-type communication may be mentioned. As an optically readable mark, for example, a bar code may be mentioned. Magnetic data readable by a magnetic head is for example recorded on magnetic tape. IC card data is data stored in a so-called magnetic card. This includes ones of a type where data is read and/or written in contact with input-output contacts and ones of a type where data is read and/or written without contact through electromagnetic waves etc.

The data discriminator is not particularly limited, but for example an optical reader, a magnetic head, a non-contact type IC card reader, and a contact-type IC card reader may be mentioned. As the optical reader, for example, there is a bar code reader. Further, as a magnetic head, a magnetic head able to read and/or write magnetic data recorded on magnetic tape etc. may be mentioned. Further, as a non-contact type IC card reader and contact type IC card reader, a device able to read data stored in an IC card by a contact or non-contact method is used.

The information shown by the identification data provided at a feed stocker and/or storing stocker is not particularly limited, but is information used for quality control of the devices held on the trays of the stockers, production control, prevention of mistaken intermixture of types of devices, etc. As an example of such information, there are the model number of the devices, lot number, date of production, date of inspection, results of inspection, socket number, and other test conditions.

The device handler according to the present invention is provided with a movement mechanism for moving the data discriminator able to read and/or write identification data provided at a feed stocker and/or storing stocker in the device holder. Therefore, even when there are a large number of cassettes in the device holder, there is no need for providing a data discriminator for each cassettes. It is sufficient to provide a single data discriminator for all stockers or a single data discriminator for a certain number of cassettes. As a result, it is possible to simplify the configuration of the handler and lower the cost while making it possible to extremely easily read and/or write identification data provided at each of the stockers.

Further, a device handler is generally provided with a tray movement mechanism for taking out device trays from feed stockers and/or sorting and storing device trays in storing stockers. Therefore, by using this tray movement mechanism to move the data discriminator in the device holder, it is possible to make common use of equipment and possible to simplify the configuration of the handler and lower its cost.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Other objects and features of the present invention will be described in detail with reference to the accompanying drawings, which are given by way of illustration only, and thus are not, limitative of the present invention, and in which.

DESCRIPTION OF THE PREFERRED EMBODIMENTS

[First Embodiment]

Figure 1:
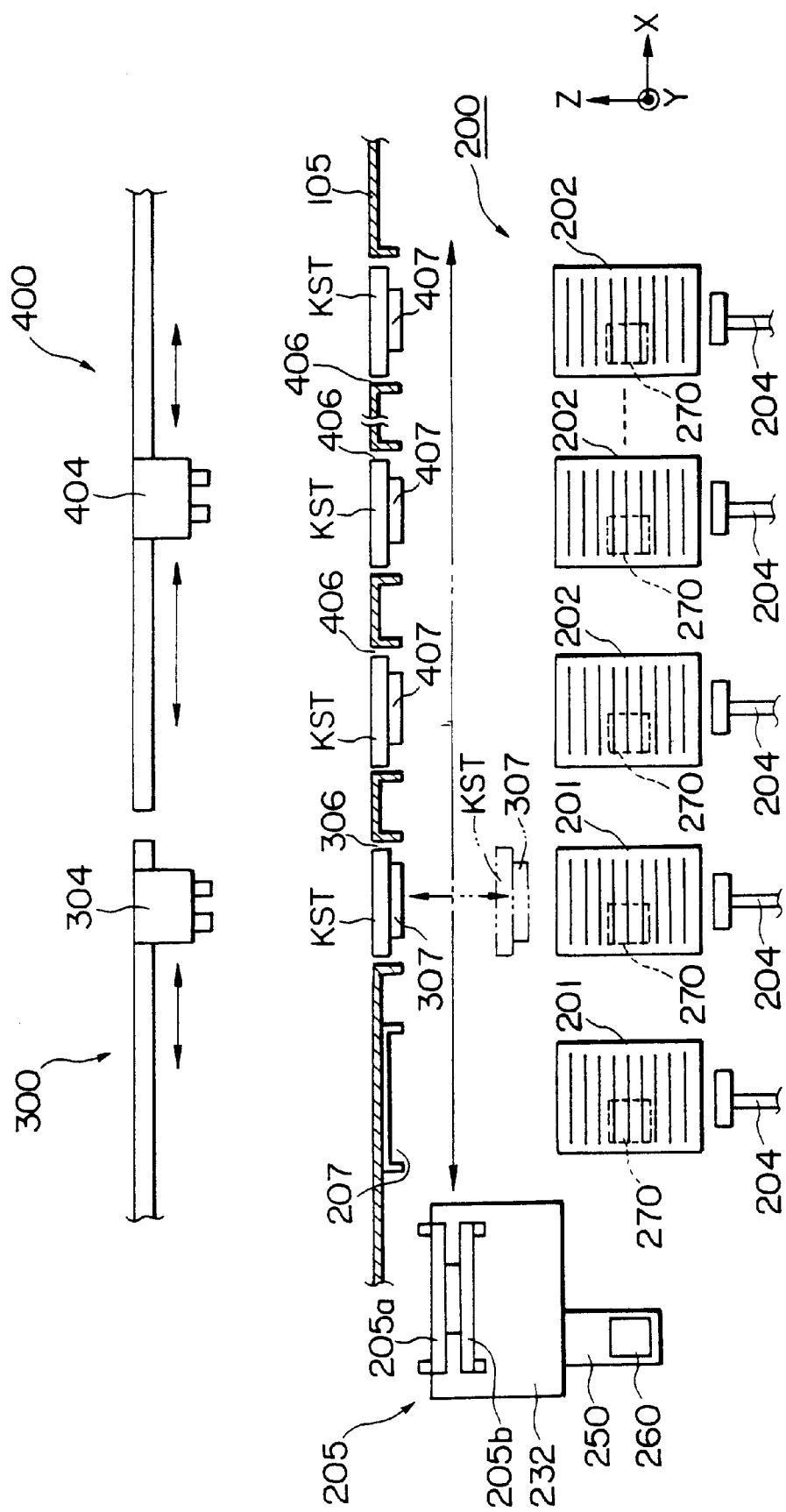
FIG. 1 is a schematic view of a device handler according to a first embodiment of the present invention.

As shown in FIG. 1, the handler corresponding to the device handler according to the present embodiment is an apparatus for sending IC chips to a test head for testing IC chips or other devices. The handler has an apparatus board 105 and has, under the apparatus board 105, a device holder 200 in which a plurality of feed stockers 201 and storing stockers 202 are arranged. Above the apparatus board 105 are positioned a loader section 300 and an unloader section 400.

The apparatus board 105 is formed with a plurality of windows 306 and 406. Each window 306 is arranged so that a customer tray KST holding pre-test IC chips conveyed from the feed stocker 201 to the loader section 300 can approach the top surface of the board 105. Each window 406 is arranged so that an empty customer tray can approach the top surface of the board 105 by the tray movement arm 205. After IC chips sorted in accordance with the test results are reloaded on the customer trays KST, they are conveyed from the unloader section 400 to the storing stockers 202.

The windows 306 and 406 are provided with holding hooks (not shown) for holding customer trays KST conveyed to the windows 306 and 406. The top surfaces of the customer trays KST are held at positions close to the surface of the apparatus board 105 through the windows 306 and 406.

Further, under the windows 306 and 406 are provided elevator tables 307 and 407 for elevating and lowering the customer trays KST. An elevator table 307 descends carrying a customer tray KST becoming empty after unloading the IC chips and transfers the empty customer tray KST to a lower tray holder 205b of the tray movement arm (tray movement mechanism). An elevator table 407 descends carrying a customer tray KST becoming full after being reloaded with the IC chips finished being tested and transfers the full tray to the lower tray holder 205b of the tray movement arm 205.

Note that instead of the elevator tables 307 and 407, it is possible to raise and lower the customer trays KST by the elevators 204 of the stockers 201 or 202 positioned directly under the windows 306 and 406.

The loader section 300 and the unloader section 400 are provided with X-Y conveyors 304 and 404. The X-Y conveyor 304 of the loader section 300 is for reloading IC chips loaded on a customer tray KST positioned at a window 306 on to for example another test tray. The IC chips reloaded on the test tray are conveyed to a not shown test head where they are tested.

The X-Y conveyor 404 of the unloader section 400 is for sorting the IC chips in accordance with the data of the test results from the test trays on which the IC chips tested at the test head are loaded to customer trays KST positioned at the windows 406.

The number of windows 406 formed at the unloader section 400 and the number of the storing stockers 202 do not necessarily have to match. For example, there are eight storing stockers 202. While there are a maximum of eight types of categories into which IC chips can be sorted, there may be four windows 406 at the unloader section 400. In this case, the categories of the IC chips able to be sorted in real time are limited to four categories. In general, good devices are sorted into the three categories of high speed response devices, medium speed response devices, and low speed response devices. This, plus defective devices, gives four categories, which are sufficient, but sometimes there are categories which do not belong to these categories such as when for example retesting is required.

In this way, when IC chips arise which would be sorted in a category other than the categories assigned to the plurality of customer trays KST arranged at the windows 406 of the unloader section 400, one customer tray KST may be returned from the unloader section 400 to the IC magazine 200 and in its place a customer tray KST for storing the IC chips of the newly arising category may be transferred to the unloader section 400 and the IC chips stored there.

Figure 2:
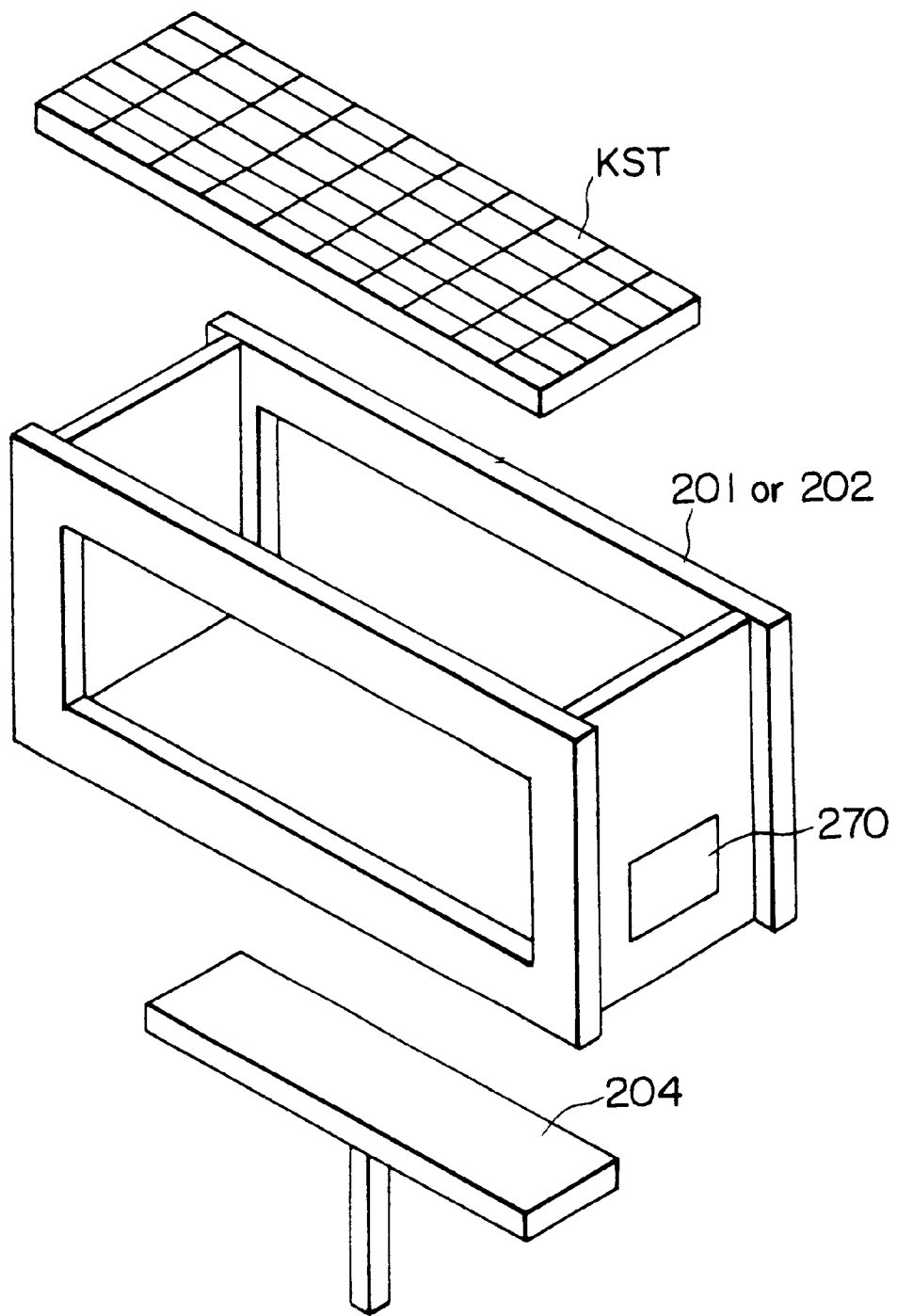
FIG. 2 is a disassembled perspective view of a stocker shown in FIG. 1.

As shown in FIG. 2, the feed stockers 201 and the storing stockers 202 have similar structures. Customer trays KST able to hold a plurality of IC chips in a matrix can be held stacked in the vertical direction. The customer trays KST can be taken out from above by the elevators 204. The feed stockers 201 and the storing stockers 202 are detachably attached to the handler.

In the present embodiment, IC cards 270 storing identification data are detachably attached to one side of the stockers 201 and 202. The IC cards may be given identification marks (letters, symbols, etc.) enabling identification by the naked eye. The stockers 201 and 202 are arranged in the device holder 200 shown in FIG. 1 so that the sides of the stockers 201 and 202 to which the IC cards are attached, as shown in FIG. 4, are positioned at the base plate 232 side of the tray movement arm 205.

As shown in FIG. 1, above the stockers 201 and 202 is provided a tray movement arm 205 able to move across the entire range of the direction of arrangement of the stockers 201 and 202. In the present embodiment, windows 306 and 406 of the loader section 300 and the unloader section 400 are provided directly above the stockers 201 and stockers 202, so the tray movement arm 205 can also move in the X-axial and Z-axial direction. Note that depending on the relationship between the device holder 200 and loader section 300 or unloader section 400, the tray movement arm 205 may be moved in all of the X-axial, Y-axial, and Z-axial directions.

The tray movement arm 205 is provided with a pair of tray holders 205a, 205b for holding customer trays KST one on top of the other and moves the customer trays KST between the loader section 300 or unloader section 400 and the device feed stockers 201 or device storing stockers 202.

Figure 3:
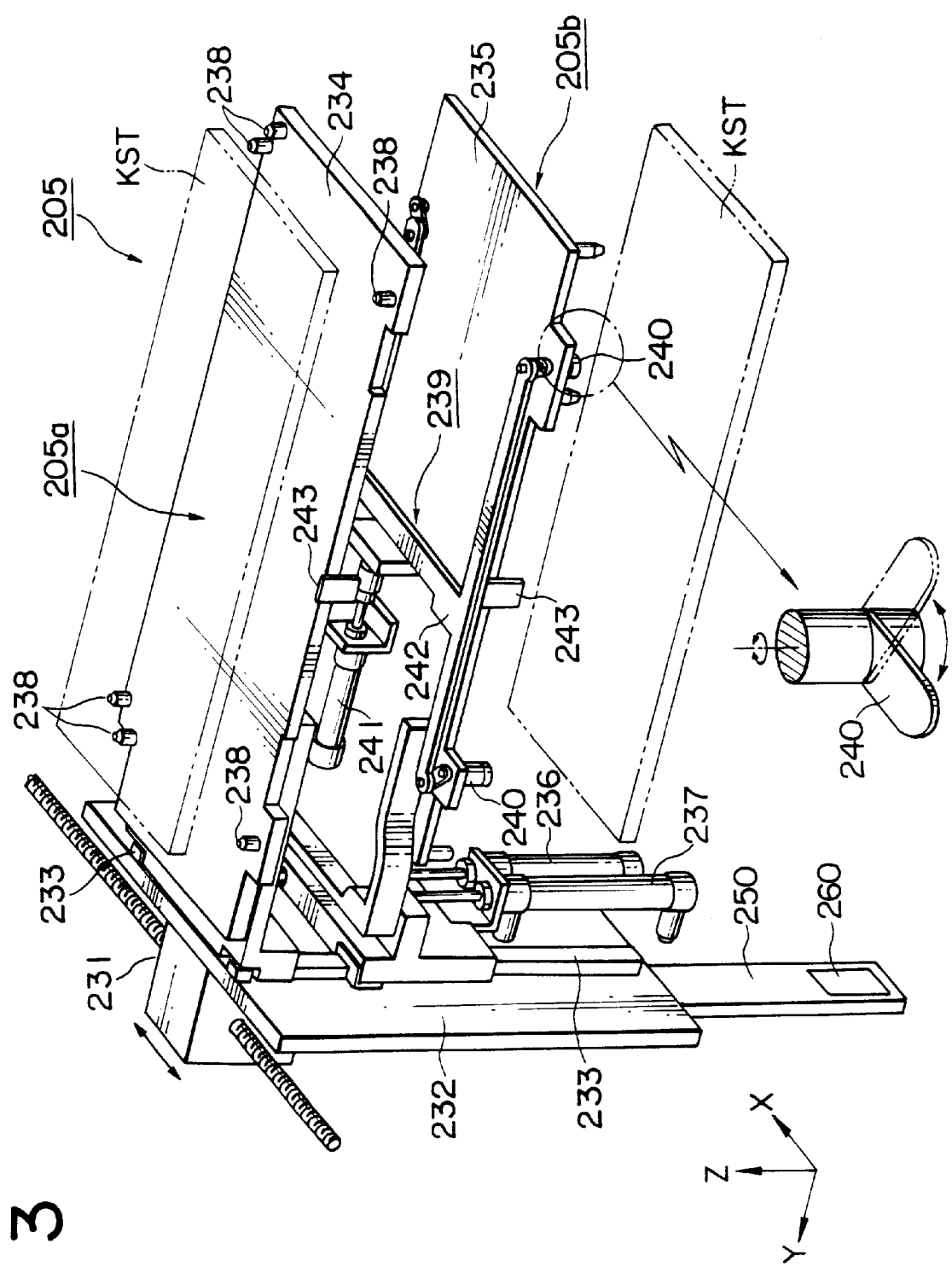
FIG. 3 is a schematic perspective view of a tray movement mechanism shown in FIG. 1.
Figure 4:
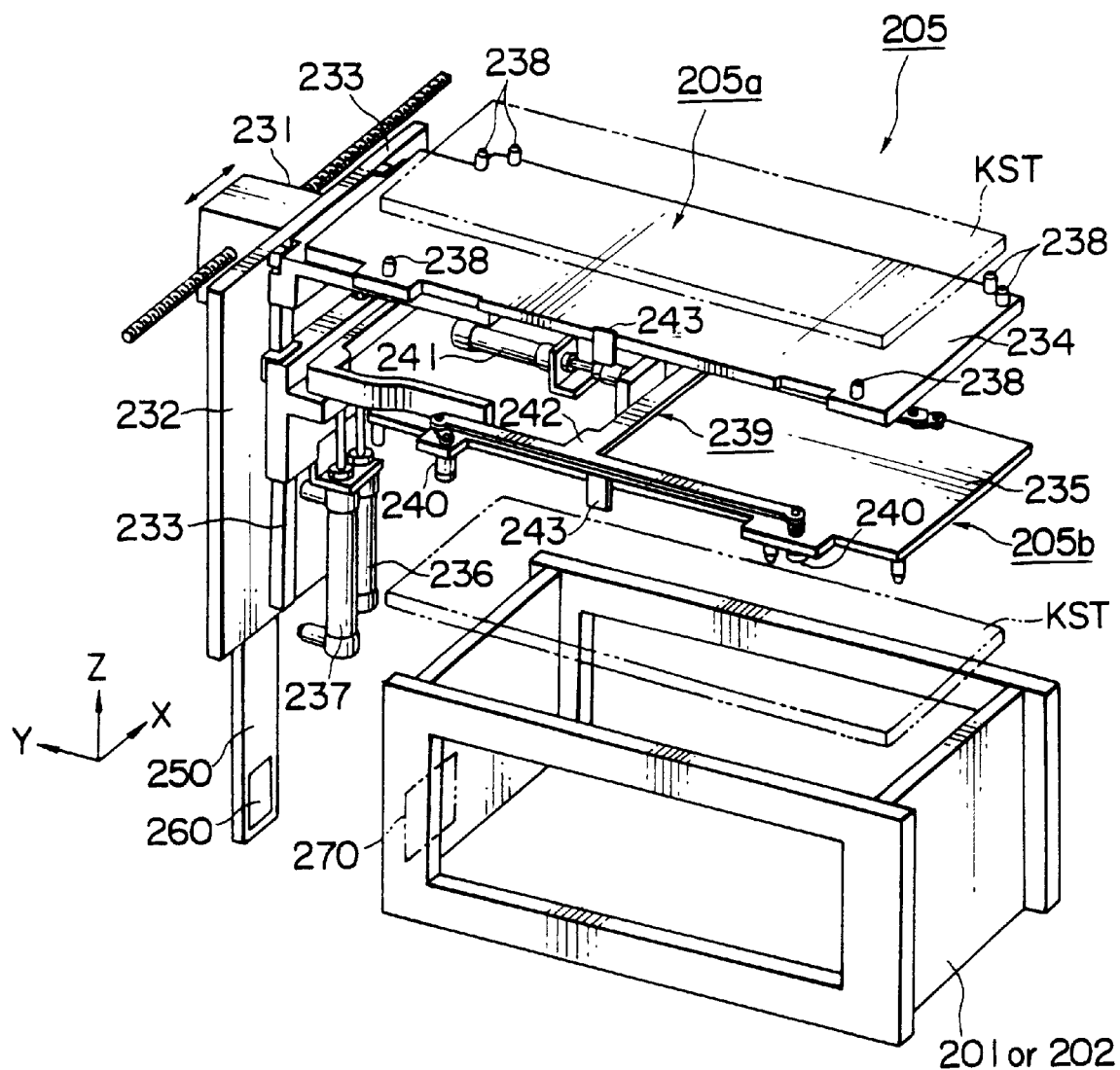
FIG. 4 is a schematic perspective view of the relationship between the tray movement mechanism and stocker.

FIG. 3 and FIG. 4 are perspective views of a specific embodiment of the tray movement arm 205. It is provided with a base plate 232 moving in the X-axial direction by a ball screw 231 operating and extending along the X-axial direction. Two tray holding plates 234, 235 are provided through a linear guide 233 extending in the Z-axial direction at a main surface of the base plate 232.

The tray holding plate 234 positioned above has secured to it a rod of a first fluid pressure cylinder 236 secured to the base plate 232. By actuation of the first fluid pressure cylinder 236, the tray holding plate 234 moves in the Z-axial direction along the linear guide 233. On the other hand, the tray holding base plate 235 positioned at the bottom has secured to it a rod of a second fluid pressure cylinder 237 secured to the base plate 232. By actuation of the second fluid pressure cylinder 237, the tray holding plate 235 moves in the Z-axial direction along the linear guide.

On the top surface of the tray holding plate 234 positioned at the top are provided, at suitable locations, guide pins 238 for guiding the rim of a customer tray KST. The plate can hold a customer tray KST by the guide pins 238.

As opposed to this, the tray holding plate 235 at the bottom holds the customer tray KST at the bottom side, so a holding hook mechanism 239 is provided so that the customer tray KST does not fall off. The holding hook mechanism 239, for example as shown in FIG. 3, is provided with hooks 240 arranged at positions corresponding to the four corners of the customer tray KST so as to open and close by a link mechanism 242 operating by a fluid pressure cylinder 241. That is, when holding the customer tray KST, the hooks 240 are opened and then the hooks 240 are closed in the state holding the customer tray KST, whereby the customer tray KST is held at the tray holding plate 235. In the same way, when releasing the customer tray KST, the plate is moved to the desired position with the hooks 240 closed and then the hooks 240 are opened there to release the customer tray KST.

Note that each of the upper tray holding plate 234 and the lower tray holding plate 235 is provided with a proximity sensor 243 for detecting the presence of a customer tray KST. The detection signal of the proximity sensor 243 is sent to a not shown controller. Further, the control of the drive of the rotation of the ball screw 231 and the control of the first and second fluid pressure cylinders 236, 237 and the fluid pressure cylinder 241 of the holding hook mechanism 239 are performed by the same not shown controller.

In the example shown in FIG. 3 and FIG. 4, one base plate 232 is provided with a pair of upper and lower tray holding plates 234, 235, but it is also possible to arrange another pair of tray holding plates 234, 235 in the X-axial direction and transfer two customer trays KST of the upper and lower tray holding plates 234, 235 at one time.

On the other hand, an empty customer tray KST transferred to the unloader section 400 is supplied from the empty tray feed stocker in the device holder 200, but the empty tray held in the empty tray feed stocker is set at the upper tray holder 205a of the tray movement arm 205, so as shown in FIG. 1, a tray setter 207 is provided. In the embodiment shown in FIG. 1, the left side feed stocker 201 among the two feed stockers 201 is an empty tray feed stocker, while the right side feed stocker 201 is a tray feed stocker in which IC chips to be tested are loaded.

The tray setter 207 shown in FIG. 1 holds an empty tray by holding hooks (not shown) when the empty tray rises by the elevator 204 from the empty tray feed stocker 201 positioned directly underneath it. The holding hooks close to hold the empty tray and open to release it.

The empty tray temporarily held at the tray setter 207 (empty customer tray KST) is transferred to the upper tray holder 205a of the tray movement arm 205 and then transferred to a specific window 406 positioned at the unloader section 400.

Note that in the embodiment shown in FIG. 1, the tray setter 207 is arranged directly above the empty tray feed stocker 201, but it is not limited to this and may be positioned elsewhere as well. In this case, however, it is not possible to transfer an empty tray from the empty tray feed stocker 201 to the tray setter 207 by just the elevator 204 alone, so it is necessary to separately provide a means for moving the empty tray in the X-axial or Y-axial direction. Further, the function of the tray setter 207 may be performed by the windows 306 and 406 of the loader section 300 or unloader section 400.

In this embodiment, as shown in FIG. 1, FIG. 3, and FIG. 4, an IC card reader 260 for reading or writing identification data of IC cards 270 provided at one side of the stockers 201 and 202 is fixed below the base plate 232 of the tray movement arm 205. The IC card reader 260 may be directly attached to the base plate 232, but may also be attached through another member 250.

The IC card reader 260 is mounted at a position corresponding to the position of attachment of the IC cards 270 provided at the sides of the stockers 201 and 202 when the tray movement arm 205 moves in the X-axial direction and is able to read and/or write identification data of the IC cards 270 provided at the sides of the stockers 201 and 202. The identification data stored in the IC cards provided at the stockers 201 and 202 includes the model numbers, lot numbers, dates of manufacturer, dates of inspection, and inspection results of the IC chips loaded on (or scheduled to be loaded on) the customer trays KST loaded in the stockers 201 and 202. The identification data stored in the IC card 270 is used for the purpose of quality control of the IC chips held (or scheduled to be held) on the trays of the stockers 201 and 202, production control, and prevention of mistaken intermixture of types of devices.

The IC card reader 260 of the present embodiment is able to read and/or write identification data stored in the IC card 270 by a non-contact method by for example just approaching the IC card 270 at a predetermined distance and enables two-way communication with the IC card 270 by a weak electromagnetic wave, infrared rays, etc. In the present embodiment, such an IC card reader 260 is fixed to a single tray movement arm 205 and can therefore move along the X-axial direction.

Therefore, even when a large number of stockers 201 and 202 are provided in the device holder 200, there is no need to provide an IC card reader 260 for each of the stockers 201 and 202. It is enough to provide a single IC card reader 260 for all of the stockers 201 and 202. As a result, it is possible to simplify the configuration of the handler and lower the cost while enabling extremely easy reading and/or writing of the identification data of the IC card 270 provided at each of the stockers 201 and 202.

Further, in the device handler of the present embodiment, since the tray movement arm 205 normally required is used to move the IC card reader in the device holder 200, a separate movement mechanism is not required, it is possible to make common use of parts, and further it is possible to simplify the configuration of the handler and lower the cost.

[Second Embodiment]

In the present embodiment, an explanation is given of a more detailed example of a device handler according to the first embodiment. Members common with those of the handler according to the first embodiment are given common reference numerals and overlapping explanations are omitted.

Figure 5:
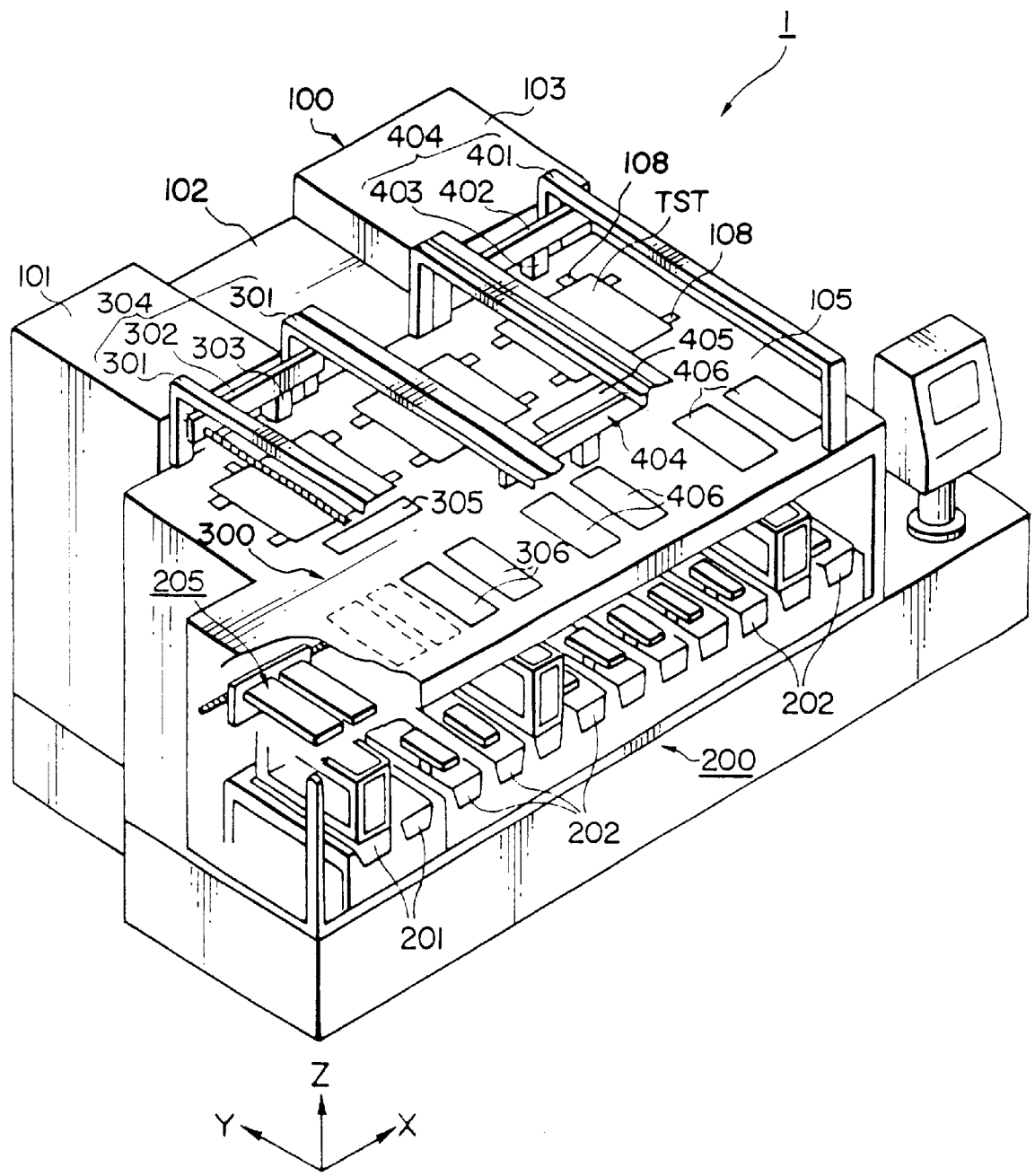
FIG. 5 is a perspective view of the handler according to the first embodiment of the present invention.
Figure 6:
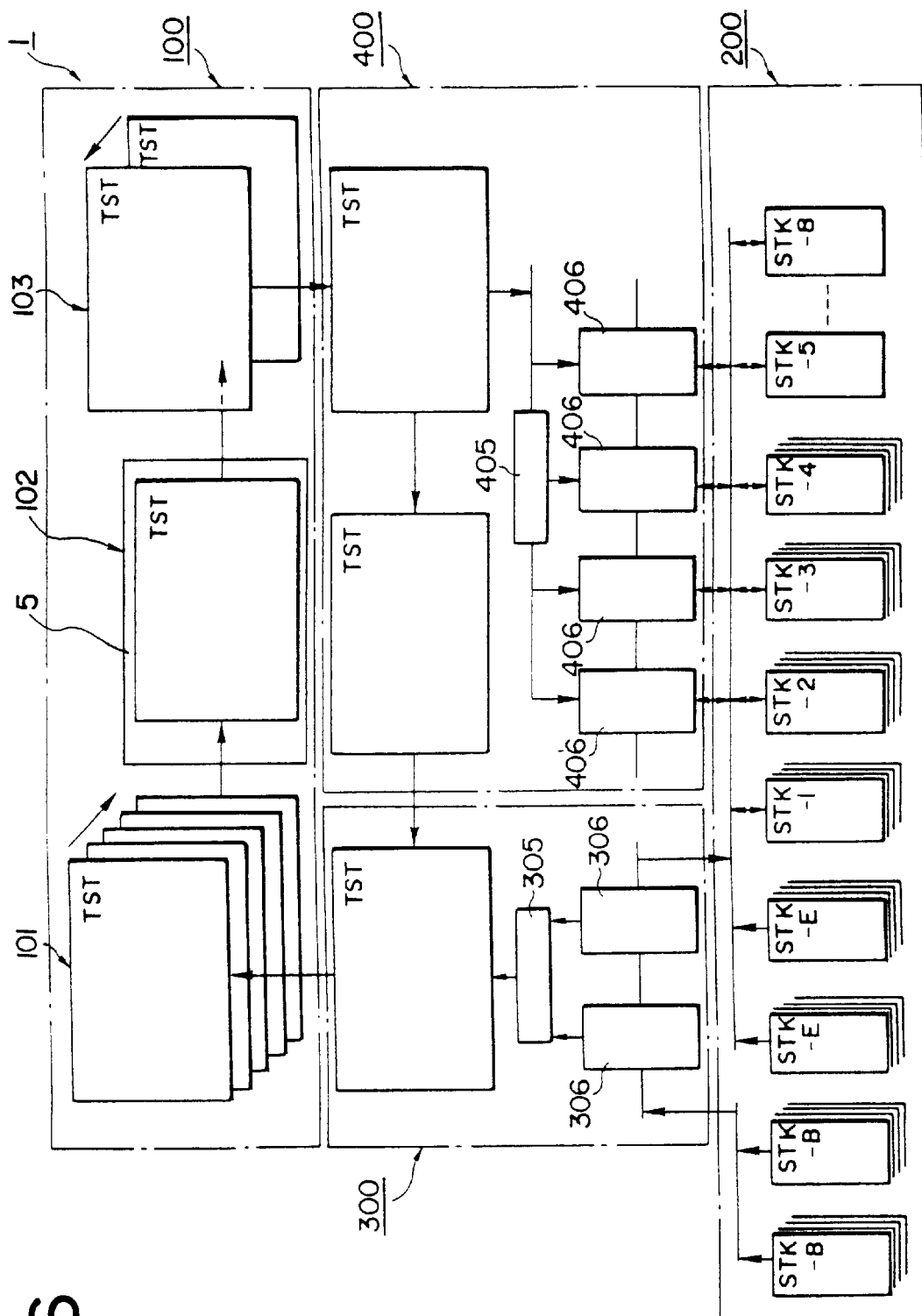
FIG. 6 is a flow chart of a tray showing the method of handling IC chips.

As shown in FIG. 5 and FIG. 6, the handler 1 according to the present embodiment executes the operation of successively conveying IC chips to be tested to IC sockets provided at the test head 5 and storing the IC chips 4 finished being tested in predetermined trays sorted in accordance with the results of the tests. The handler 1 is a device for testing IC chips, corresponding to devices under test, at a temperature state higher than ordinary temperature (high temperature) or a temperature state lower than it (low temperature) and has a chamber 100. The chamber 100 is provided with a constant temperature chamber 101 for giving a desired high temperature or low temperature thermal stress to the IC chips to be tested, a test chamber 102 for testing IC chips in the state given the thermal stress at the constant temperature chamber 101, and a soaking chamber 103 for removing the thermal stress from the IC chips tested at the test chamber 102.

Note that FIG. 6 is a view for explaining the method of handling IC chips to be tested at the handler of the present embodiment. Some portions show by a plane view members which are actually arranged in the vertical direction. Therefore, the mechanical (three-dimensional) structure may be understood by mainly referring to FIG. 5.

As shown in FIG. 5 and FIG. 6, the handler 1 of the present embodiment is comprised of an IC magazine 200 for storing the IC chips to be tested and the IC chips finished being tested sorted into categories, a loader section 300 for sending IC chips sent from the IC magazine 200 to a chamber section 100, a chamber section 100 including a test head, and an unloader section 400 for sorting and taking out IC chips which had been tested at the chamber section 100. Inside the handler 1, IC chips are held on and conveyed by trays.

A large number of IC chips before being held in the handler 1 are held on a customer tray KST shown in FIG. 2. In that state, they are supplied to the IC magazine 200 of the handler 1 shown in FIG. 5 and FIG. 6. There, the IC chips 2 are reloaded from the customer tray KST to a test tray TST conveyed in the handler 1 (see FIG. 7). Inside the handler 1, as shown in FIG. 6, the IC chips move in a state loaded on the test tray TST, are given a high temperature or low temperature thermal stress, are tested (examined) if they are suitably operating, and are sorted in accordance with the test results.

The inside structure of the handler 1 will be described below in more detail.

IC Magazine 200

As shown in FIG. 4, the IC magazine 200 is provided with a pre-test IC tray stocker 201 for holding IC chips to be tested and a post-test IC tray stocker 202 for holding IC chips classified in accordance with the test results.

The pre-test IC tray stocker 201 shown in FIG. 5 holds stacked customer trays KST on which the IC chips to be tested are held. The post-test IC tray stocker 202 holds stacked customer trays KST on which IC chips finished being tested are suitably sorted.

Note that since the pre-test IC stocker 201 and the post-test IC stocker 202 are structured the same, portions of the pre-test IC tray stocker 201 may be used as the post-test IC tray stocker 202 and vice versa. Therefore, the number of the pre-test IC tray stockers 201 and the number of the post-test IC tray stockers 202 may be easily changed in accordance with need.

In the embodiment shown in FIG. 5 and FIG. 6, as the pre-test tray stocker 201, two stockers STK-B are provided. Next to the stockers STK-B, as an empty tray feed stocker 201, two empty stockers STK-E to be sent to the unloader section 400 are provided. Next to that, as the post-test IC stocker 202, eight stockers STK-1, STK-2, . . . , STK-8 are provided and can hold ICs sorted into a maximum of eight classes according to the test results. That is, in addition to classifying ICs as good and defective, it is possible to divide the good ICs into ones with high operating speeds, ones with medium speeds, and ones with low speeds and the defective ICs into ones requiring retesting etc.

Loader Section 300

A customer tray KST accommodated in the pre-test IC tray feed stocker 201 shown in FIG. 2 is, as shown in FIG. 5, conveyed from the lower side of the apparatus board 105 to a window 306 of the loader section 300 by a tray movement arm 205 provided between the IC magazine 200 and apparatus board 105. Further, in the loader section 300, the IC chips loaded on the customer tray KST are transferred once to a preciser 305 by the X-Y-conveyor 304. There, the mutual positions of the IC chips are corrected, then the IC chips transferred to the preciser 305 are reloaded on the test tray TST stopped at the loader section 300 using the X-Y conveyor 304 again.

The IC conveyor 304 reloading the IC chips from a customer tray KST to the test tray TST, as shown in FIG. 5, is provided with two rails 301 laid over the top of the apparatus board 105, a movable arm 302 able to move back and forth (this direction designated as the Y-direction) between the test tray TST and a customer tray KST by these two rails 301, and a movable head 303 supported by the movable arm 302 and able to move in the X-direction along the movable arm 302.

The movable head 303 of the X-Y conveyor 304 has suction heads attached facing downward. The suction heads move while drawing out air to pick up the IC chips from the customer tray KST and reload the IC chips on the test tray TST. For example, about eight suction heads are provided on the movable head 303, so it is possible to reload eight IC chips at one time on the test tray TST.

Note that in a general customer tray KST, the indentations for holding the IC chips are formed relatively larger than the shapes of the IC chips, so there is a large variation in the positions of the IC chips in the state held on the customer tray KST. Accordingly, when IC chips are picked up by the suction heads and conveyed directly to the test tray TST, it becomes difficult to accurately drop them into the IC storage indentations formed in the test tray TST. Therefore, in the handler 1 of the present embodiment, provision is made of a means for correcting the positions of the IC chips called a "preciser" 305 between the setting position of the customer tray KST and the test tray TST. This preciser 305 has relatively deep indentations. The periphery of the indentations is shaped to be inclined, so when IC chips picked up by the suction heads are dropped in those indentations, the dropping positions of the IC chips are corrected by the inclined surfaces. Due to this, the positions of the eight IC chips are accurately determined. By picking up the repositioned IC chips again by the suction heads and reloading them on the test tray TST, it is possible to reload the IC chips precisely in the IC storage indentations formed in the test tray TST.

Chamber Section 100

The above-mentioned test tray TST is conveyed into the chamber section 100 after being loaded with the IC chips by the loader section 300, then the IC chips are tested in a state held on the test tray TST.

The chamber section 100 is comprised of a constant temperature chamber 101 for giving a desired high temperature or low temperature thermal stress to the IC chips loaded on the test tray TST, a test chamber 102 for making the IC chips contact the test head in a state given the thermal stress by the constant temperature chamber 101, and a soak chamber 103 for removing the given thermal stress from the IC chips tested in the test chamber 102.

In the soak chamber 103, when a high temperature was applied in the constant temperature chamber 101, the IC chips are cooled by blowing in air to return them to room temperature. Alternatively, when a low temperature of about −30° C. has been applied in the constant temperature chamber 101, it heats the IC chips by hot air or a heater etc. to return them to a temperature where no condensation occurs. Next, the thus treated IC chips are conveyed out to the unloader section 400.

As shown in FIG. 5, the constant temperature chamber 101 and the soak chamber 103 are arranged to project up from the test chamber 102. Further, the constant temperature chamber, as shown conceptually in FIG. 6, is provided with a vertical conveyor. A plurality of test trays TST wait on standby being supported by the vertical conveyor until the test chamber 102 becomes empty. While standing by, a high temperature or low temperature thermal stress is applied to the IC chips.

Figure 7:
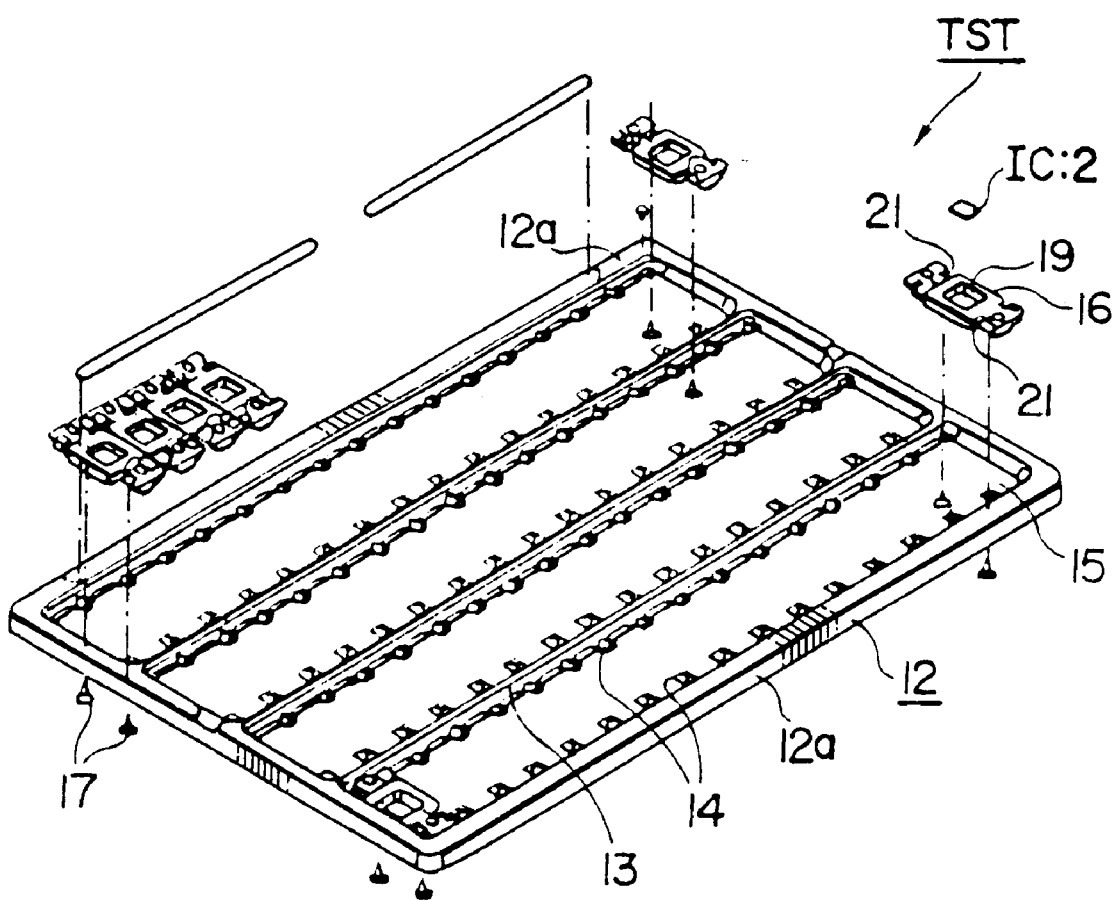
FIG. 7 is a partial disassembled perspective view of a test tray used by the handler.

As shown in FIG. 6, the test chamber 102 has a test head 5 arranged at its center of the bottom. A test tray TST is conveyed above the test head 5. There, all of the IC chips 2 held by the test tray TST shown in FIG. 7 are simultaneously or successively brought into electrical contact with the test head 5 to test all of the IC chips 2 in the test tray TST. On the other hand, the test tray TST finished being tested is treated in the soak chamber 103 to return the temperature of the IC chips 2 to room temperature, then is ejected to the unloader section 400 shown in FIG. 5 and FIG. 6.

Further, as shown in FIG. 5, above the constant temperature chamber 101 and the soak chamber 103 are formed an inlet opening for sending test trays TST from the apparatus board 105 and an outlet opening for sending test trays TST to the apparatus board 105. The apparatus board 105 has a test tray conveyor 108 mounted on it for taking out and inserting test trays TST from the openings. The conveyer 108 is comprised of rotating rollers for example. A test tray TST ejected from the soak chamber 103 by the test tray conveyor 108 provided on the apparatus board 105 is returned to the constant temperature chamber 101 through the unloader section 400 and the loader section 300.

FIG. 7 is a disassembled perspective view of the structure of a test tray TST used in the present embodiment. The test tray TST is comprised of a rectangular frame 12. The frame 12 is provided with a plurality of crosspieces 13 in parallel at equal intervals. A plurality of mounting pieces 14 are formed projecting out in the longitudinal direction at equal intervals at the two sides of these crosspieces 13 and the insides of the sides 12a of the frame 12 parallel to the crosspieces 13. Insert holders 15 are comprised by the two mounting pieces 14 facing each other in the plurality of mounting pieces 14 provided between these crosspieces 13 and between the crosspieces 13 and the sides 12a.

The insert holders 15 are designed to receive one insert 16 each. The insert 16 is attached to the two mounting pieces 14 in a floating state using fasteners 17. Therefore, mounting holes 21 to the mounting pieces 14 are formed at the two ends of the inserts 16. For example, about 16×4 of these inserts 16 are provided in one test tray TST.

Note that the inserts 16 are made the same shape and same dimensions and that the IC chips 2 are received in the inserts 16. The IC holder 19 of an insert 16 is determined by the shape of the IC chip 2 to be received and in the example shown in FIG. 7 is made a rectangular indentation.

Figure 8:
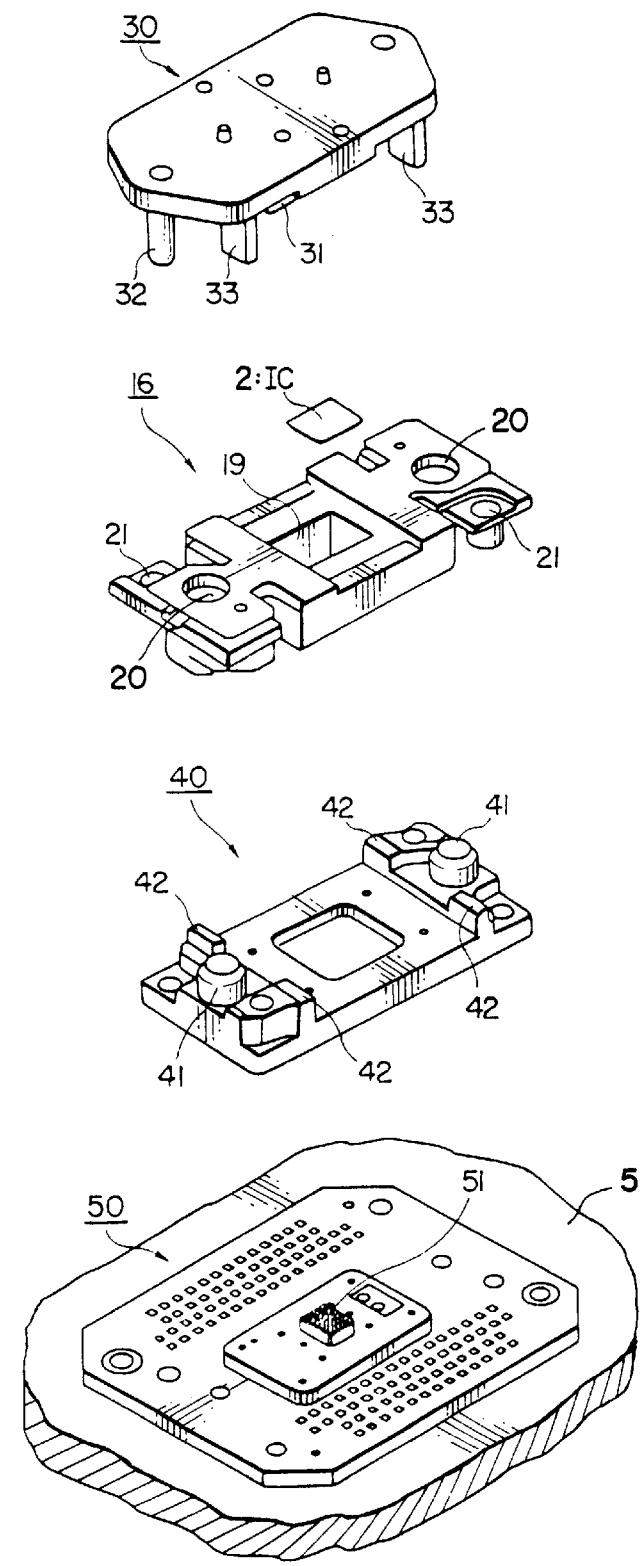
FIG. 8 is a disassembled perspective view giving an example of the structure near a socket in a test head of a handler.

Here, if the IC chips 2 are arranged in four rows and 16 columns as shown in FIG. 7, then for example IC chips once connected to the test head 5 are a total of four columns of IC chips arranged at every fourth place in the row direction. That is, in the first test, the total of 16 IC chips 2 arranged every fourth column from the first column are tested being connected to the contact pins 51 of the sockets 50 of the test head 5 as shown in FIG. 8. In the second test, the test tray TST is moved one column's worth and the IC chips arranged every fourth column from the second column are similarly tested. By doing this a total of four times, all of the IC chips 2 are tested. The results of the test are stored in a controller of the handler 1 at addresses determined by for example the identification number assigned to the test tray TST and the numbers of the IC chips assigned inside the test tray TST.

As shown in FIG. 8, a number of sockets 50 corresponding to the total four columns of IC chips 2 every fourth place in the row direction (4 rows×4 columns) are provided on the test head 5. Note that if it is possible to reduce the size of each of the sockets 50, the 4 rows×16 columns of sockets 50 may be provided on the test head 5 to enable simultaneous testing of all of the IC chips 2 held on the test tray TST shown in FIG. 7.

As shown in FIG. 8, a socket guide 40 is attached for every socket 50 at the top of the test head 5 where the sockets 50 are arranged. The socket guides 40 are secured to the sockets 50.

A test tray TST shown in FIG. 7 is conveyed above the test head 5. A number of inserts 16 (total of 16 of total of four columns every fourth column in the test tray TST) corresponding to intervals of the IC chips to be tested at one time are positioned on the corresponding socket guides 40.

Figure 9:
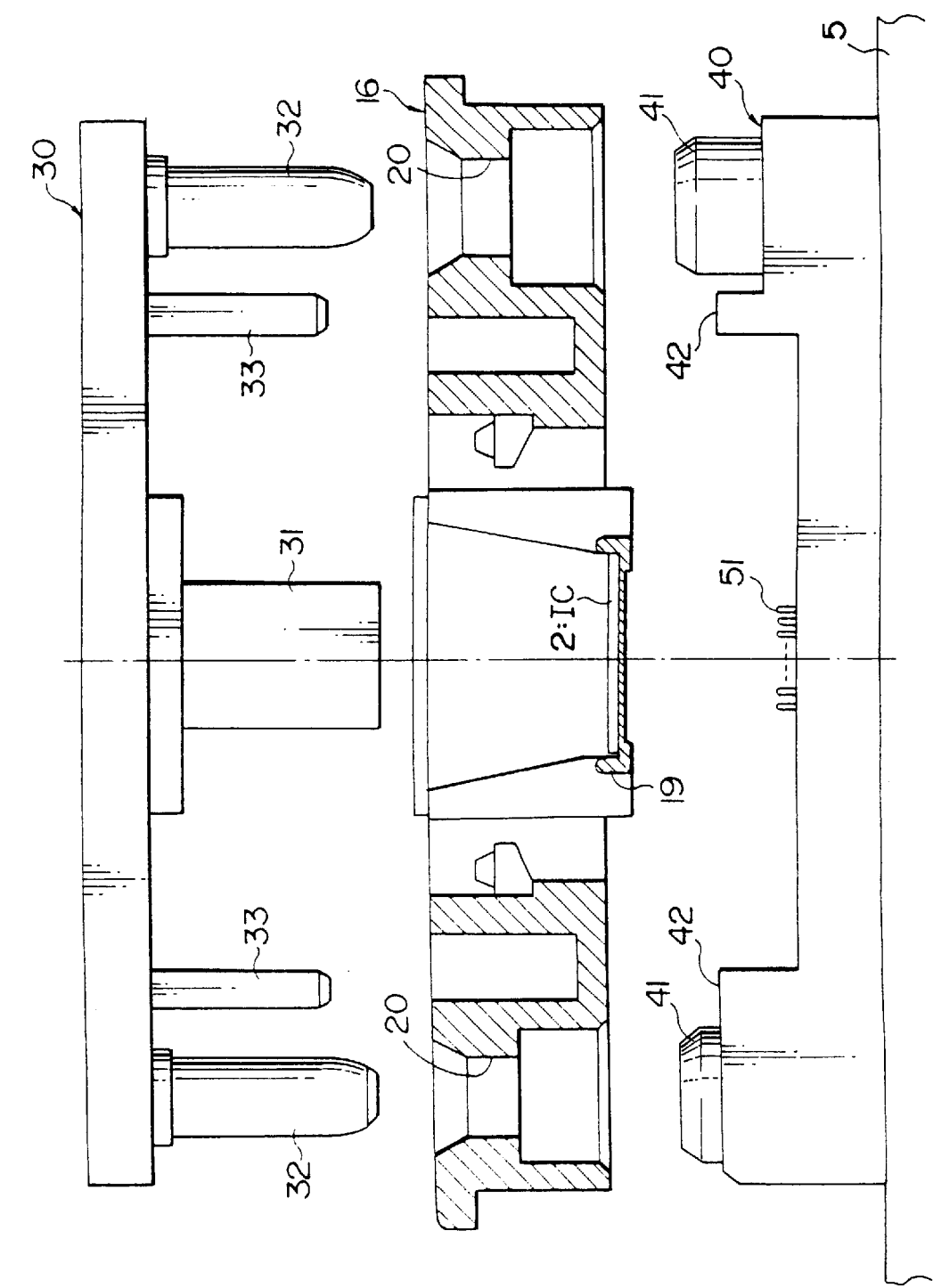
FIG. 9 is a sectional view of the socket area shown in FIG. 8.

A number of pushers 30 shown in FIG. 8 corresponding to the number of the socket guides 40 is provided at the top side of the test head 5. At the center of each pusher 30 is formed a pushing element 31 for pushing against an IC chip as shown in FIG. 8 and FIG. 9. At the two sides of each are provided guide pins 32 for insertion into guide holes 20 of an insert 16 and guide bushes 31 of the socket guide 40. Further, between the pushing element 31 and the guide pins 32 are provided stopper guides 33 for defining a lower limit when the pusher 30 descends due to the Z-axial drive. The stopper guides 33 abut against the stopper face 42 of the socket guide 40, whereby the lower limit position of the pusher for pressing against an IC chip 2 by a suitable pressure not breaking it is determined.

Figure 10:
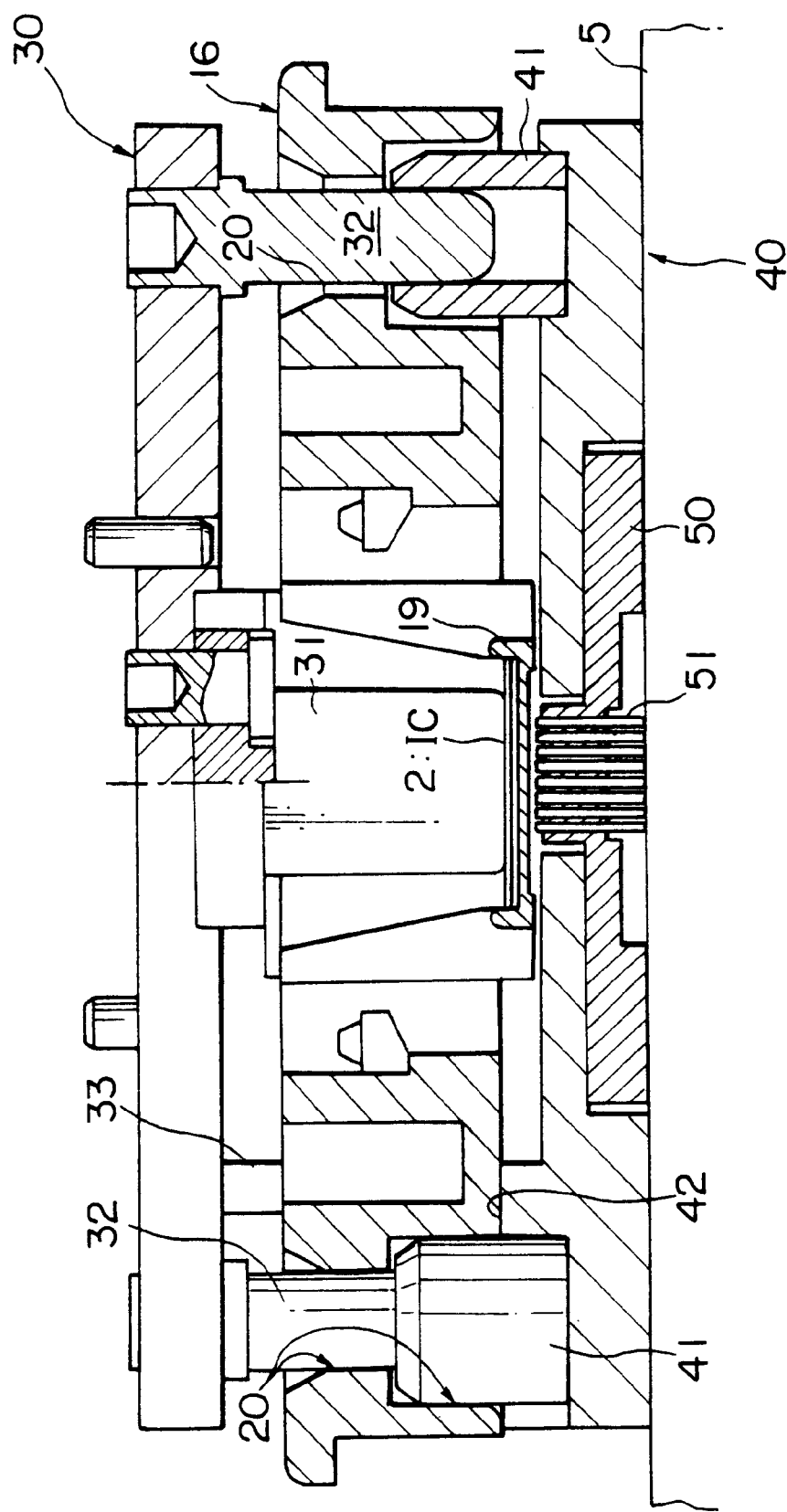
FIG. 10 is a sectional view of the state of descent of a pusher in the socket area of a test head.

The inserts 16 are attached to the test tray TST using fasteners 17 as shown in FIG. 7. As shown in FIGS. 8 to 10, each is formed at its two sides with guide holes 20 through which the above-mentioned guide pins 32 of the pusher 30 and the guide bushes 41 of the socket guide 40 are inserted.

As shown in FIG. 10 showing the descended state of a pusher 30, the guide hole 20 at the left side in the figure is a positioning hole and has an inside diameter smaller than the guide hole 20 at the right side. Therefore, a guide pin 32 of the pusher 30 is inserted in the upper half of the guide hole 20 for positioning, while the guide bush 41 of the socket guide 40 is inserted in the lower half for positioning. Note that the guide hole 20 at the right side in the figure fits loosely with the guide pin 32 of the pusher 30 and the guide bush 41 of the socket guide 40.

As shown in FIG. 9 and FIG. 10, the insert 16 is formed at its center with an IC holder 19. By dropping an IC chip 2 here, the IC chip is loaded on the test tray TST shown in FIG. 7.

As shown in FIGS. 9 and 10, the socket guide 40 fixed to the test head 5 is provided at its two sides with guide bushes 41 for insertion of the two guide pins 32 formed at the pusher 30 and positioning with these two guide pins 32. The guide bush 41 at the left side also performs positioning with the insert 16.

As shown in FIG. 10, at the lower side of the socket guide 40 is fixed a socket 50 having a plurality of contact pins 51. These contact pins 51 are biased in the upward direction by not shown springs. Therefore, even if pushing an IC chip, the contact pins 51 will retract to the top surface of the socket 50. On the other hand, it is possible for the contact pins 51 to contact all of the IC terminals of the IC chip 2 even if the IC chip 2 is pushed somewhat at an angle.

Unloader Section 400

The unloader section 400 shown in FIG. 5 and FIG. 6 is also provided with X-Y conveyors 404, 404 of the same structure as the X-Y conveyor 304 provided at the loader section 300. The X-Y conveyors 404, 404 reload the tested IC chips from the test tray TST carried out to the unloader section 400 to the customer tray KST.

As shown in FIG. 5, the apparatus board 105 of the unloader section 400 is provided with two pairs of windows 406, 406 arranged so that the customer trays KST carried to the unloader section 400 can be brought close to the top surface of the apparatus board 105.

Further, while not illustrated, elevator tables for elevating or lowering customer trays KST are provided below the windows 406. A customer tray KST becoming full after being reloaded with the tested IC chips is placed on there and lowered and the full tray is passed to the tray transfer arm 205.

Note that in the handler 1 of the present embodiment, while there are a maximum of eight types of sortable categories, it is only possible to arrange a maximum of four customer trays KST at the windows 406 of the unloader section 400. Therefore, there is a limit of four categories which may be sorted into in real time. In general, good devices are sorted into the three categories of high speed response devices, medium speed response devices, and low speed response devices. This, plus defective devices, gives four categories, which are sufficient, but sometimes there are categories which do not belong to these categories such as when for example retesting is required.

In this way, when IC chips arise which would be sorted in a category other than the categories assigned to the four customer trays KST (see FIG. 2) arranged at the windows 406 of the unloader section 400, one customer tray KST may be returned from the unloader section 400 to the IC magazine 200 and in its place a customer tray KST for storing the IC chips of the newly arising category may be transferred to the unloader section 400 and the IC chips stored. When exchanging the customer trays KST in the middle of the sorting work, there is the problem that the throughput will fall because of stopping the sorting work. Therefore, in the handler 1 of the present embodiment, a buffer section 405 is provided between the test tray TST and the window 406 of the unloader section 400 and IC chips of a category rarely appearing are stored temporarily at this buffer section 405.

For example, the buffer section 405 is given the capacity to store 20 to 30 or so IC chips. Further, a memory is provided for storing the categories of the IC chips stored at the IC storage positions of the buffer section 405. The categories and positions of the IC chips temporarily stored at the buffer section 405 are stored for all of the IC chips. In the intervals between sorting work or when the buffer section 405 becomes full, the customer tray KST of the category to which the IC chips stored in the buffer section 405 belong is called up from the IC magazine 200 and the IC chips are stored in that customer tray KST. At this time, there are also cases where the IC chips temporarily stored in the buffer section 405 extend over a number of categories. At this time, it is sufficient to call up a plurality of customer trays KST to the windows 406 of the unloader section 400 at one time when calling up the customer trays KST.

In the handler 1 according to the present embodiment, by providing an IC card reader at the tray movement arm 205 and providing IC cards storing identification data at the cassettes 201 and 202, the same action and effects are exhibited as in the first embodiment.

[Third Embodiment]

Figure 11:
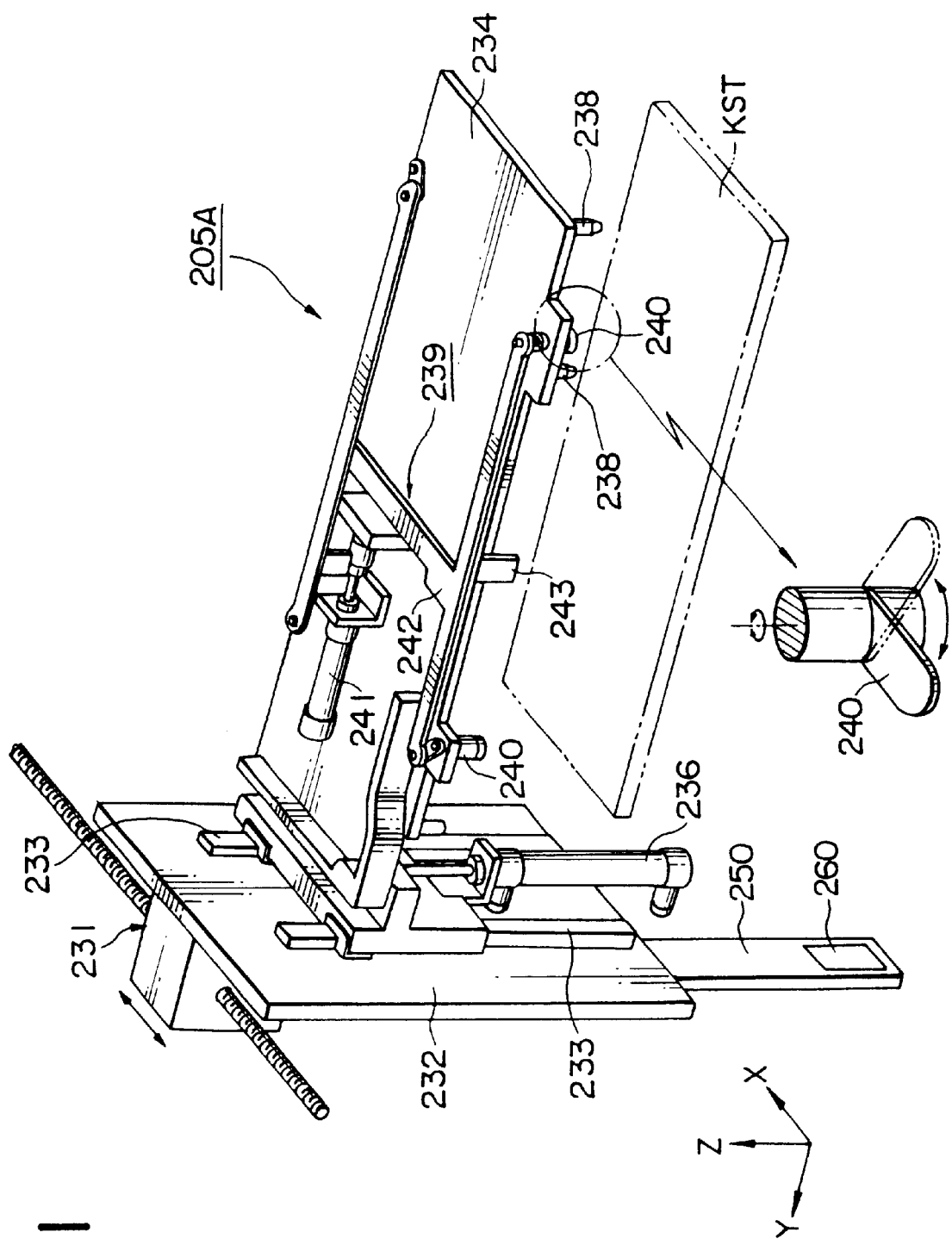
FIG. 11 is a schematic perspective view of a device handler according to another embodiment of the present invention.

The handler of the present embodiment has the same structure as the handler of the first embodiment except for having the tray movement arm 205A shown in FIG. 11 for example instead of the tray movement arm 205 (see FIG. 3) used in the handler of the first embodiment.

The tray movement arm 205A shown in FIG. 11 differs from the tray movement arm 205 shown in FIG. 3 in that it has only a single tray holding plate 234 and can hold a customer tray KST at just the bottom surface of the tray holding plate 234.

The tray movement arm 205A shown in FIG. 11, in the same way as the tray movement arm 205 shown in FIG. 3, provides another tray holding plate 234 in the X-axial direction and is designed to move one customer tray KST each (total two) at one time by the pair of tray holding plates 234 in the X-axial direction. The rest of the configuration and operation are exactly the same as those of the tray movement arm 205 shown in FIG. 3, so the same members are assigned the same reference numerals and explanations thereof are omitted.

[other Embodiments]

Note that the present invention is not limited to the above embodiments and may be modified in various ways within the scope of the present invention.

For example, in the above embodiments, the feed stockers 201 and the storing stockers 202 were configured to be detachable from the handler, but one or more of the stockers 201 and 202 may also be fixed to the handler. Further, the devices handled by the device handler according to the present invention is not limited to IC chips and may be other devices as well. Further, the specific structure of the device handler is not limited to the illustrated embodiments. Further, in accordance with the invention, the IC card reader 260 as a data discriminator may be fixed in the device holder 200 and the feed stockers 201 and/or storing stockers 202 may be held movably with respect to the IC card reader 260 in the device holder.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

As explained above, according to the device handler of the present invention, it is possible to simplify the configuration of the handler and lower the cost while enabling extremely easy reading and/or writing of identification data provided at a feed stocker and/or storing stocker.

What is claimed is:

1. A device handler having a device holder in which a plurality of stockers for accommodating a plurality of IC chip trays able to receive a plurality of IC chips are provided, said device handler comprising:
   a data discriminator able to read identification data provided at each of the stockers; and
   a movement mechanism for moving relatively the data discriminator with respect to the stockers in the device holder.

2. The device handler as set forth in claim 1, wherein the movement mechanism serves also as a tray movement mechanism for taking out the IC chip trays from the stockers, sorting and storing the IC chip trays in the stockers.

3. The device handler as set forth in claim 1, wherein the identification data is one of an optically readable mark, magnetic data readable by a magnetic head, IC card data readable by non-contact type communication, and IC card data readable by contact-type communication.

4. The device handler as set forth in claim 2, wherein the identification data is one of an optically readable mark, magnetic data readable by a magnetic head, IC card data as readable by non-contact type communication, and IC card data readable by contact-type communication.

5. The device handler as set forth in claim 1, wherein said data discriminator is one of an optical reader, a magnetic head, a non-contact type IC card reader, and a contact-type IC card reader.

6. The device handler as set forth in claim 2, wherein said data discriminator is one of an optical reader, a magnetic head, a non-contact type IC card reader, and a contact-type IC card reader.

7. A device handler having a device holder in which at least one feed stocker for accommodating a plurality of pre-test trays able to receive a plurality of pre-test IC chips and storing stockers for accommodating a plurality of post-test trays able to receive a plurality of post-test IC chips are provided, said device handler comprising:
   a data discriminator able to at least one of read and write identification data provided at each of the feed stockers and storing stockers; and
   a movement mechanism for moving relatively the data discriminator with respect to the feed stocker and storing stockers in the device holder,
   the movement mechanism serving as a tray movement mechanism for taking out the pre-test trays from the feed stocker, sorting and storing the post-test trays in the storing stockers.

8. The device handler as set forth in claim 7, wherein the tray movement mechanism comprises a tray holder for holding detachably at least one of the pre-test trays and the post-test tray.

9. The device handler as set forth in claim 7, wherein the tray movement mechanism comprises a pair of tray holders for holding detachably at least one of the pre-test trays and the post-test trays, said pair of tray holders are provided substantially in the upper and lower direction of the tray movement mechanism and said pair of tray holders are provided facing away from each other.

10. The device handler as set forth in claim 7, wherein the stockers are detachably provided in the device holder.

11. The device handler as set forth in claim 7, wherein the feed stocker and the storing stockers are detachably provided in the device holder.

* * * * *